United States Patent

Jansseune

[11] Patent Number: 6,043,646
[45] Date of Patent: Mar. 28, 2000

[54] PROXIMITY SWITCH WITH MAGNETIC FIELD-SENSITIVE SENSOR

[75] Inventor: Luc Jansseune, Brugge, Belgium

[73] Assignee: Siemens Aktiengesellschaft, Munich, Germany

[21] Appl. No.: 08/793,214
[22] PCT Filed: Aug. 31, 1995
[86] PCT No.: PCT/DE95/00173
§ 371 Date: Jul. 9, 1997
§ 102(e) Date: Jul. 9, 1997
[87] PCT Pub. No.: WO96/07112
PCT Pub. Date: Mar. 7, 1996

[30] Foreign Application Priority Data

Aug. 31, 1994 [DE] Germany .................. 94 14 104 U

[51] Int. Cl.[7] .......................... H03K 17/95; H01H 36/00; G01B 7/14
[52] U.S. Cl. ................ 324/207.26; 307/116; 324/207.2; 324/235; 361/180
[58] Field of Search ..................... 324/173, 174, 324/207.2, 207.21, 207.26, 235, 239, 240; 73/DIG. 3; 307/116, 117; 327/510, 511; 361/179, 180; 340/547, 551

[56] References Cited

U.S. PATENT DOCUMENTS

| 3,226,631 | 12/1965 | Kuhrt et al. .............. 324/207.2 X |
| 4,086,533 | 4/1978 | Ricouard et al. ................. 324/207.2 |
| 4,524,932 | 6/1985 | Bodziak ...................... 324/207.2 X |
| 4,618,823 | 10/1986 | Dahlheimer et al. ........ 324/207.26 X |
| 4,712,064 | 12/1987 | Eckhardt et al. . |
| 4,745,363 | 5/1988 | Carr et al. . |
| 4,992,731 | 2/1991 | Lorenzen ..................... 324/207.2 X |
| 5,137,677 | 8/1992 | Murata . |
| 5,210,489 | 5/1993 | Petersen . |
| 5,450,009 | 9/1995 | Murakami ................... 324/207.21 |

FOREIGN PATENT DOCUMENTS

| 39 01 678 | 6/1990 | Germany . |
| 1-122532 | 5/1989 | Japan . |
| 2-236183 | 9/1990 | Japan . |

Primary Examiner—Gerard Strecker
Attorney, Agent, or Firm—Hill & Simpson

[57] ABSTRACT

A proximity switch with a magnetic field-sensitive sensor is formed of limbs of a U-shaped permanent magnet with a vertical direction of magnetization. A magnetic flux-free region, in which the sensor is fitted, is formed by three like poles. When a flat ferromagnetic triggering part is brought close to the two poles of the limbs of the U in a plane parallel to the base of the U, a switching signal which is triggered from the sensor by the cancellation of the magnetic flux-free region can be evaluated.

8 Claims, 1 Drawing Sheet

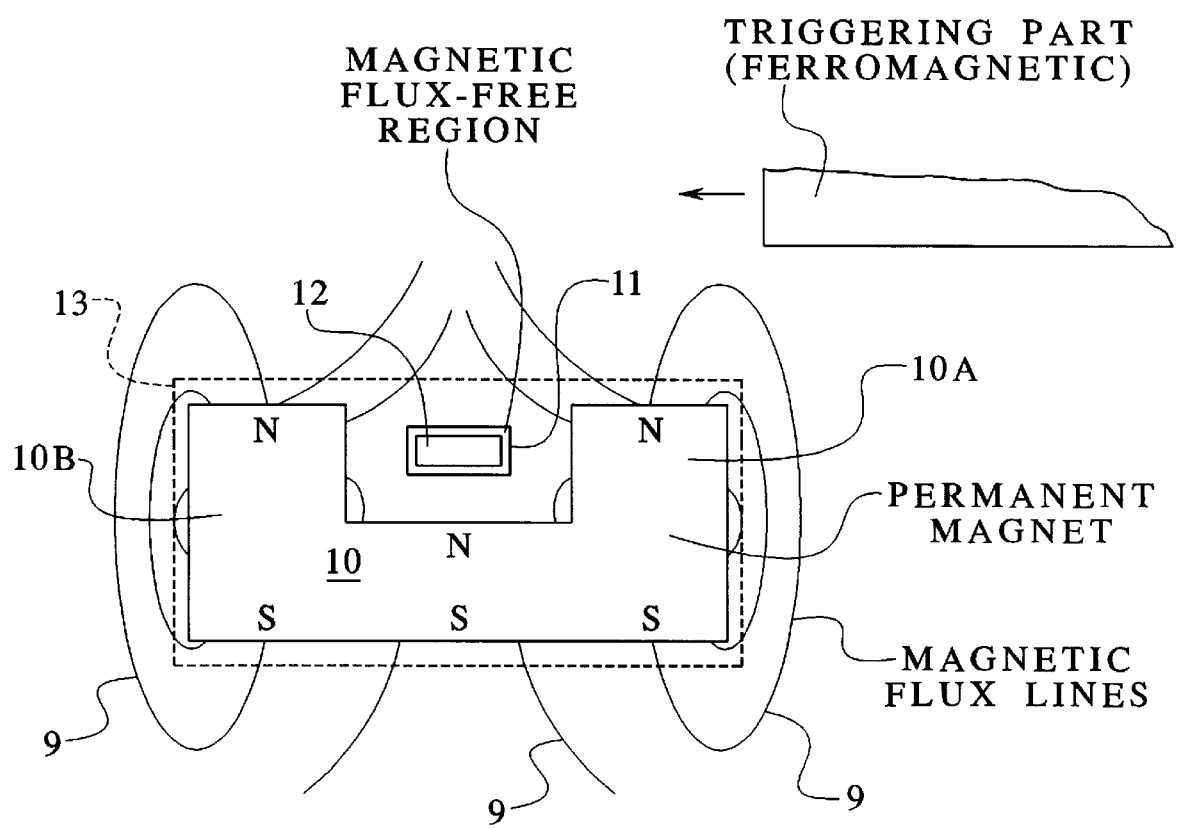

PROXIMITY SWITCH WITH MAGNETIC FIELD-SENSITIVE SENSOR

BACKGROUND OF THE INVENTION

1. Field of the Invention

The invention relates to a proximity switch having a magnetic field-sensitive sensor.

Conventional mechanical switches are increasingly being displaced, in particular in motor vehicle applications, by non-contacting proximity switches having a magnetic field-sensitive sensor, for example a Hall sensor or a magneto resistor. In principle, Hall sensors are composed of a semiconductor layer, in particular one made of silicon, which is supplied with a constant current. The constant current is influenced by a magnetic field component at right angles to the layer and the sensor supplies a Hall voltage which may be evaluated and which is proportional to the applied magnetic field strength. At present, Hall sensors are expediently used in the form of an integrated circuit which already contains an evaluation circuit which is suitable for evaluating the switching state.

2. Description of the Prior Art

German Offenlegungsschrift 39 01 678 discloses positioning the magnetic field-sensitive sensor in a magnetic field-free zone of a special permanent magnet arrangement. In order to achieve a high temperature stability, the permanent magnet in the known proximity switch is therefore configured in such a way that an annular pole surface results. In this case, driving by a flat ferromagnetic triggering part is carried out at right angles to the pole plane, the magnetic field-free zone not being canceled when the triggering part is brought close but only when moving away from the sensor.

SUMMARY OF THE INVENTION

The object of the present invention is to provide a proximity switch having a magnetic field-sensitive sensor which is particularly simply constructed and is very simple to produce.

According to the invention, this object is achieved by a proximity switch having a magnetic field-sensitive sensor, having a U-shaped permanent magnet with vertical direction of magnetization, a magnetic flux-free region, in which the magnetic field-sensitive sensor is fitted, being formed between the limbs of the U by three like, mutually repelling poles, having a flat ferromagnetic triggering part which can be brought close above the limbs of the U in a plane parallel to the base of the U, and wherein a switching signal can be evaluated which is triggered from the sensor by the cancellation of the magnetic flux-free region when the triggering part is brought close to the two poles of the limbs of the U.

The invention is explained in further detail below with reference to an exemplary embodiment represented in the single FIGURE of the drawing.

BRIEF DESCRIPTION OF THE DRAWING

The FIGURE shows, in a side view, a magnet system of a proximity switch according to the invention.

DESCRIPTION OF THE PREFERRED EMBODIMENTS

A U-shaped magnet 10 with a vertical direction of magnetization is represented in the FIGURE. Flux lines are shown at 9. There is a magnetic flux-free region 11 between the limbs 10A and 10B of the U, since the three north poles repel one another. A magnetic field-sensitive sensor 12 is fitted in this region 11. When a ferromagnetic triggering part 14 is brought close to the U-shaped magnet 10, above the magnet, in the plane indicated, the two lateral north poles are partly shielded or their magnetic field is deflected. The magnetic flux of the central north pole is then able to penetrate better, that is to say it flows through the magnetic field sensor 12 and thus triggers a switching signal.

The rectangular flux-free region 11 shown in the drawing figure has a longitudinal extent (horizontal in the drawing) which is substantially perpendicular to a magnetic pole axis (vertical axis running through N and S poles in the drawing) of each of the limbs.

The arrangement represented is particularly simply constructed and space-saving. It is also advantageous that shielding of the sensor from three sides results from the particular geometric configuration of the magnet system. A reduced magnetic susceptibility to faults of the sensor is of significance, for example in the case of applications of the proximity switch in motor vehicle central locking systems.

A switch which was constructed by way of a trial already had a switching distance of 1.5 mm given dimensions of in each case 4 mm for the thickness of the magnet and for the width of the limbs of the U and for the region between the limbs. This switching distance can readily be optimized further by suitable determination of the dimensions of the U magnets, that is to say it can be increased. A relatively great switching distance is desired, since in practice tolerances occur between the proximity switch, which is incorporated in a lock, for example, and the triggering part, the tolerances being able to lead to an excessive distance between the triggering part which is brought close and the switch in the event of too small a switching distance.

In a proximity switch according to the invention, the proximity switch comprises a housing for the permanent magnet, shown in dashed lines at 13, which is composed of thermoplastic. The permanent magnet is composed of a plastic-bonded permanent magnet powder. The permanent magnet 10 and the housing 13 are produced using two-component injection molding; The housing is molded directly onto the permanent magnet. The permanent magnet is magnetized after the encapsulation, and may be produced particularly cost effectively. For instance, in this arrangement the U magnet is injection molded first and is subsequently encapsulated by the housing. The two components are therefore molded one after the other in one and the same injection molding machine. This can be carried out particularly simply if different plastics are used for the housing and the permanent magnet. Even in the case of the same plastics, the theoretical risk of resoftening of a previously injection-molded component can be countered by appropriate adaptation of the injection-molding parameters and molding cycle times, so that the individual components can be molded one after the other and can be molded on without the components sticking to one another.

The essential steps of the production process can, for example, be carried out in such a way that a copper tape is stamped and subsequently electroplated, that Hall chips having two to three connections are, for example, directly bonded on one side, and that this populated copper tape subsequently runs into an injection molding machine. There, the plastic-bonded permanent magnet powder, for example polyester granules, and then the housing with molded-in circuit board are then molded one after the other. The magnetic field sensor 12 is either molded into the housing at the same time or is subsequently inserted.

Although various minor changes and modifications might be proposed by thosed skilled in the art, it will be understood that my wish is to include within the claims of the patent warranted hereon all such changes and modifications as reasonably come within my contribution to the art.

I claim as my invention:

1. A proximity switch, comprising:

a U-shaped permanent magnet with a vertical direction of magnetization, said permanent magnet defining a magnetic flux-free region formed by three like mutually repelling poles and positioned between limbs of the U-shaped magnet;

a magnetic field-sensitive sensor positioned in said magnetic flux-free region between said limbs and inwardly of terminating ends of said limbs, said flux-free region having a longitudinal extent substantially perpendicular to a magnetic pole axis of each of said limbs;

a flat ferromagnetic triggering part positionable closely above said limbs of the U-shaped magnet in a plane parallel to a base of the U-shaped magnet; and a switching signal triggered from the sensor by at least partial cancellation of the magnetic flux-free region when the triggering part is brought close to poles of said limbs of the U-shaped magnet, the switching signal being capable of evaluation to indicate activation of the proximity switch.

2. The proximity switch according to claim 1 wherein the permanent magnet is formed of a plastic-bonded permanent magnet powder.

3. The proximity switch according to claim 1 wherein the permanent magnet is encapsulated in a housing together with said magnetic field-sensitive sensor so that said magnetic field-sensitive sensor is fixed in said magnetic flux-free region by said housing.

4. A method for constructing a proximity switch, comprising the steps of:

forming a U-shaped permanent magnet with a vertical direction of magnetization with a plastic-bonded permanent magnet powder, the U-shaped permanent magnet having a magnetic flux-free region between limbs of the U-shaped magnet caused by three like mutually repelling poles of the U-shaped permanent magnet, said flux-free region having a longitudinal extent substantially perpendicular to a magnetic pole axis of each of said limbs;

providing a magnetic field-sensitive sensor and positioning said magnetic field-sensitive sensor in said magnetic flux-free region between said limbs and inwardly of terminating ends of said limbs by encapsulating the U-shaped permanent magnet and the magnetic field-sensitive sensor in a housing; and dimensioning said housing such that a flat ferromagnetic triggering part can be brought close above said limbs of the U-shaped magnet in a plane parallel to a base of the U-shaped magnet so that a switching signal is triggered from the sensor by cancellation of the magnetic flux-free region when the triggering part is brought close to poles of said limbs of the U-shaped magnet, the switching signal being capable of evaluation to indicate activation of the proximity switch.

5. The method according to claim 4 including the steps of forming the housing around the permanent magnet by an injection molding directly onto the permanent magnet, and magnetizing the permanent magnet after encapsulation.

6. The method according to claim 4 wherein the magnetic field-sensitive sensor is molded into the housing at the same time the housing is being molded.

7. The method according to claim 4 wherein the magnetic field-sensitive sensor is inserted into the housing after the housing has been injection molded.

8. A proximity switch system, comprising:

a U-shaped permanent magnet with a vertical direction of magnetization, said permanent magnet defining a magnetic flux-free region formed by three like mutually repelling poles and positioned between limbs of the U-shaped magnet, a first of the like poles being in a base of the U-shaped magnet between the limbs and second and third ones of the like poles being at ends of said limbs, said flux-free region having a longitudinal extent substantially perpendicular to a magnetic pole axis of each of said limbs;

a magnetic field-sensitive sensor positioned in said magnetic flux-free region between said limbs and inwardly of terminating ends of said limbs;

a housing encapsulating the permanent magnet and the sensor and positioning the sensor relative to the magnet;

a flat ferromagnetic triggering part positionable closely above said limbs of the U-shaped magnet in a plane parallel to the base of the U-shaped magnet; and a switching signal triggered from the sensor by cancellation of the magnetic flux-free region when the triggering part is brought close to poles of said limbs of the U-shaped magnet, the switching signal being capable of evaluation to indicate activation of the proximity switch.

* * * * *